United States Patent
Park et al.

(10) Patent No.: US 12,185,559 B2
(45) Date of Patent: Dec. 31, 2024

(54) ORGANIC LIGHT-EMITTING DISPLAY APPARATUS HAVING PIXEL ELECTRODES WITH VARYING FLATNESS

(71) Applicant: Samsung Display Co., Ltd., Yongin-si (KR)

(72) Inventors: Hyunsuk Park, Yongin-si (KR); Katsushi Kishimoto, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 515 days.

(21) Appl. No.: 17/450,612

(22) Filed: Oct. 12, 2021

(65) Prior Publication Data
US 2022/0255033 A1 Aug. 11, 2022

(30) Foreign Application Priority Data
Feb. 9, 2021 (KR) .......................... 10-2021-0018529

(51) Int. Cl.
*H01L 29/08* (2006.01)
*H10K 50/125* (2023.01)

(52) U.S. Cl.
CPC .................................. *H10K 50/125* (2023.02)

(58) Field of Classification Search
CPC .................................................. H10K 50/125
USPC ........................................................ 257/40
See application file for complete search history.

(56) References Cited

U.S. PATENT DOCUMENTS

| | | |
|---|---|---|
| 6,335,772 B1 | 1/2002 | Sato et al. |
| 8,994,904 B2 | 3/2015 | Jiroku |
| 9,153,796 B2 | 10/2015 | Sato et al. |
| 9,853,093 B2 | 12/2017 | Shim et al. |
| 9,922,595 B2 | 3/2018 | Hirai et al. |
| 9,966,390 B2 | 5/2018 | Yamazaki et al. |
| 10,141,384 B2 | 11/2018 | Takata |
| 10,297,794 B2 | 5/2019 | Sung et al. |
| 2007/0235777 A1* | 10/2007 | Nagata ............. H01L 29/78606 257/E27.113 |
| 2011/0101888 A1* | 5/2011 | Uchida ................ H10K 71/441 438/34 |
| 2019/0043931 A1* | 2/2019 | Yim ..................... H10K 50/844 |
| 2019/0280056 A1* | 9/2019 | Yasukawa ............. H10K 59/35 |
| 2020/0127242 A1 | 4/2020 | Yang et al. |
| 2021/0143357 A1 | 5/2021 | Katsushi |
| 2022/0140016 A1* | 5/2022 | Zeng ..................... H10K 59/35 257/72 |

FOREIGN PATENT DOCUMENTS

| | | |
|---|---|---|
| JP | 3918864 B2 | 5/2007 |
| JP | 2015-019074 A | 1/2015 |
| JP | 5648437 B2 | 1/2015 |

(Continued)

*Primary Examiner* — Phuc T Dang
(74) *Attorney, Agent, or Firm* — Lewis Roca Rothgerber Christie LLP (57) ABSTRACT

An organic light-emitting display apparatus includes: a first pixel electrode; a second pixel electrode spaced apart from the first pixel electrode and comprising a top surface that is flatter than a top surface of the first pixel electrode; a first color emission layer on the first pixel electrode; and a second color emission layer on the second pixel electrode and configured to emit light having a wavelength longer than a wavelength of light emitted by the first color emission layer.

14 Claims, 7 Drawing Sheets

(56) References Cited

FOREIGN PATENT DOCUMENTS

| | | |
|---|---|---|
| JP | 2017-515276 A | 6/2017 |
| JP | 6164402 B2 | 7/2017 |
| JP | 2018-133144 A | 8/2018 |
| KR | 10-2016-0032970 A | 3/2016 |
| KR | 10-2016-0034458 A | 3/2016 |
| KR | 10-2018-0016669 A | 2/2018 |
| KR | 10-2020-0046196 A | 5/2020 |
| KR | 10-2021-0057274 A | 5/2021 |

\* cited by examiner

ORGANIC LIGHT-EMITTING DISPLAY APPARATUS HAVING PIXEL ELECTRODES WITH VARYING FLATNESS

CROSS-REFERENCE TO RELATED APPLICATION

The present application claims priority to and the benefit of Korean Patent Application No. 10-2021-0018529, filed on Feb. 9, 2021, in the Korean Intellectual Property Office, the disclosure of which is incorporated by reference herein in its entirety.

BACKGROUND

1. Field

Aspects of one or more embodiments relate to an organic light-emitting display apparatus.

2. Description of the Related Art

An organic light-emitting display apparatus includes an organic light-emitting device as a display device. The organic light-emitting device further includes a pixel electrode, a counter electrode, and an intermediate layer including an emission layer located between the pixel electrode and the counter electrode. Also, the organic light-emitting display apparatus includes an electronic device and/or a wiring for controlling an electrical signal applied to the organic light-emitting device.

The above information disclosed in this Background section is only for enhancement of understanding of the background and therefore the information discussed in this Background section does not necessarily constitute prior art.

SUMMARY

Aspects of one or more embodiments relate to an organic light-emitting display apparatus, and for example, to an organic light-emitting display apparatus capable of displaying a high-quality image.

In some organic light-emitting display apparatuses a ratio of a luminance in a pixel that emits light of a certain color to a luminance in a pixel that emits light of another color may be different from a preset ratio.

Aspects of one or more embodiments include an organic light-emitting display apparatus capable of displaying relatively high-quality images. However, aspects of embodiments according to the present disclosure are not limited thereto, and the above characteristics do not limit the scope of embodiments according to the present disclosure.

Additional aspects will be set forth in part in the description which follows and, in part, will be apparent from the description, or may be learned by practice of the presented embodiments.

According to one or more embodiments, an organic light-emitting display apparatus includes a first pixel electrode, a second pixel electrode spaced apart from the first pixel electrode and including a top surface having a flatness greater than a flatness of a top surface of the first pixel electrode, a first color emission layer on the first pixel electrode, and a second color emission layer on the second pixel electrode and configured to emit light having a wavelength longer than the wavelength of light emitted by the first color emission layer.

According to some embodiments, the wavelength of light emitted by the first color emission layer may belong to a wavelength band ranging from about 450 nm to about 495 nm.

According to some embodiments, the wavelength of light emitted by the second color emission layer may belong to a wavelength band ranging from about 495 nm to about 570 nm.

According to some embodiments, a root mean square (RMS) of a stepped portion of the top surface of the first pixel electrode may range from about 14 nm to about 33 nm.

According to some embodiments, an (RMS) of a stepped portion of the top surface of the second pixel electrode may range from about 11 nm to about 22 nm.

According to some embodiments, the organic light-emitting display apparatus may further include a third pixel electrode spaced apart from the first pixel electrode and the second pixel electrode and including a top surface having a flatness greater than the flatness of the top surface of the second pixel electrode, and a third color emission layer on the third pixel electrode and configured to emit light having a wavelength longer than the wavelength of light emitted by the second color emission layer.

According to some embodiments, the wavelength of light emitted by the first color emission layer may belong to a wavelength band ranging from about 450 nm to about 495 nm.

According to some embodiments, the wavelength of the light emitted by the second color emission layer may belong to a wavelength band ranging from about 495 nm to about 570 nm.

According to some embodiments, the wavelength of light emitted by the third color emission layer may belong to a wavelength band ranging from about 630 nm to about 750 nm.

According to some embodiments, an RMS of a stepped portion of the top surface of the first pixel electrode may range from about 14 nm to about 33 nm.

According to some embodiments, an RMS of a stepped portion of the top surface of the second pixel electrode may range from about 11 nm to about 22 nm.

According to some embodiments, an RMS of a stepped portion of the top surface of the third pixel electrode may range from about 2 nm to about 11 nm.

Other aspects, features, and characteristics of embodiments according to the present disclosure will become more apparent from the detailed description, the claims, and the drawings.

BRIEF DESCRIPTION OF THE DRAWINGS

The above and other aspects, features, and characteristics of certain embodiments will be more apparent from the following description taken in conjunction with the accompanying drawings, in which.

DETAILED DESCRIPTION

Reference will now be made in more detail to aspects of some embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the detailed description. Effects and features of the disclosure, and methods for achieving them will be clarified with reference to embodiments described below in detail with reference to the drawings. However, the disclosure is not limited to the following embodiments and may be embodied in various forms.

Hereinafter, aspects of some embodiments will be described in more detail with reference to the accompanying drawings, wherein the same or corresponding elements are denoted by the same reference numerals throughout and a repeated description thereof is omitted.

It will be understood that when a component, such as a layer, a film, a region, or a plate, is referred to as being "on" another component, the component may be directly on the other component or intervening components may be present therebetween. Also, sizes of elements in the drawings may be exaggerated or contracted for convenience of description. For example, because sizes and thicknesses of elements in the drawings are arbitrarily illustrated for convenience of description, the disclosure is not limited thereto.

In the following embodiments, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Figure 1:
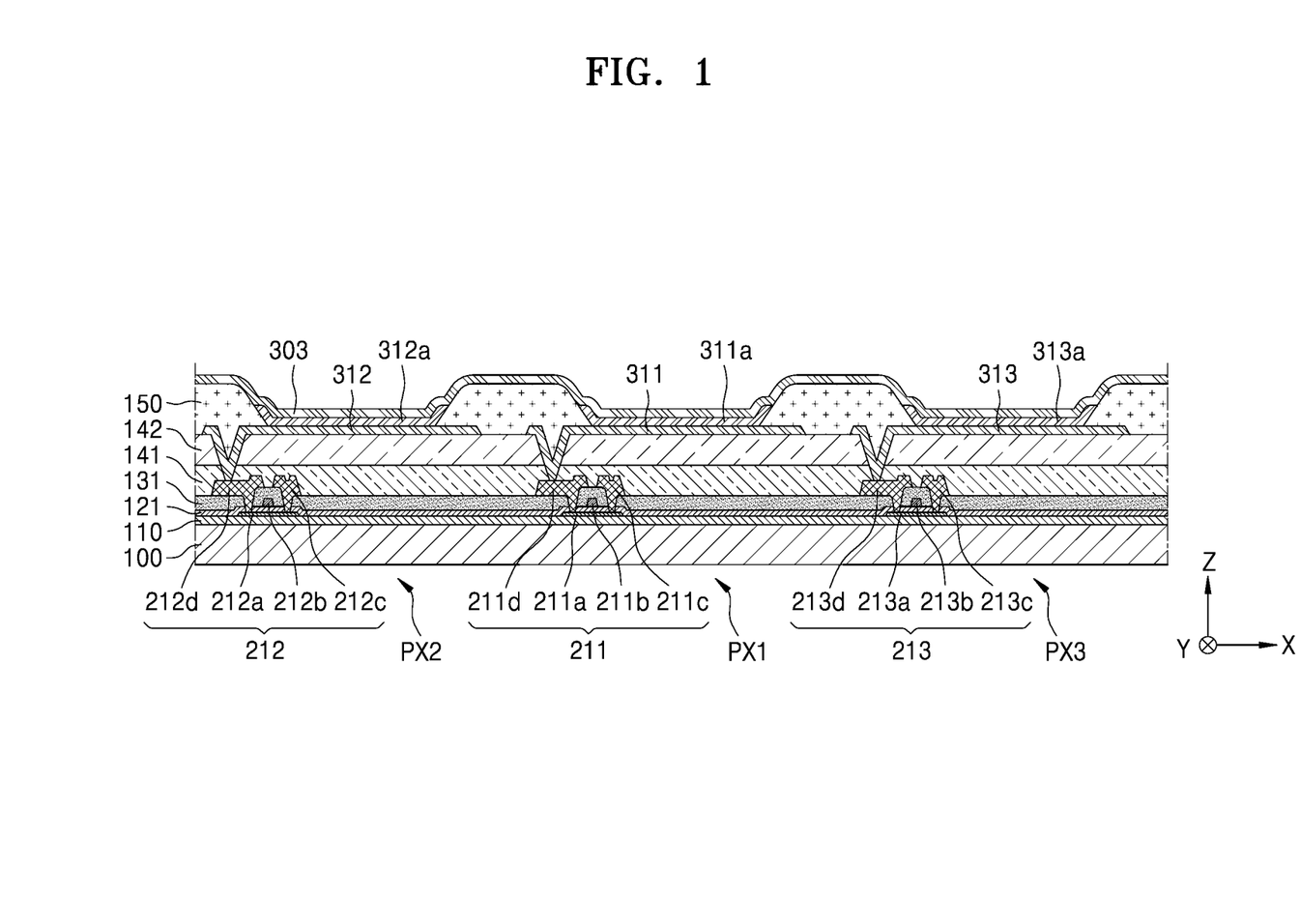
FIG. 1 is a cross-sectional view schematically illustrating a portion of a display apparatus, according to some embodiments.

FIG. 1 is a cross-sectional view schematically illustrating a portion of an organic light-emitting display apparatus, according to some embodiments. FIG. 1 illustrates a part of each of three pixels of the organic light-emitting display apparatus for convenience of description. Elements of thin-film transistors may not be located in the same zx plane as illustrated in FIG. 1. For example, a second gate electrode 212$b$, a second source electrode 212$c$, and a second drain electrode 212$d$ of a second thin-film transistor 212 may not all be located in the same zx plane. Various modifications may be made. For example, in one zx plane, only the second gate electrode 212$b$ and the second source electrode 212$c$ may be located, and the second drain electrode 212$d$ may not be in that plane.

Also, the three pixels may not be located in the same zx plane. For example, various modifications may be made. For example, in one zx plane, only a first pixel PX1 and a second pixel PX2 may be located, and a third pixel PX3 may not be seen.

In a display apparatus according to some embodiments, a plurality of pixels are located in a display area as shown in FIG. 1. A peripheral area located outside the display area includes a pad area to which various electronic devices or printed circuit boards are electrically attached. Accordingly, it may be understood that a substrate 100 may include the display area and the peripheral area.

Additionally, although FIG. 1 illustrates three pixels, embodiments according to the present disclosure are not limited thereto, and a person having ordinary skill in the art would understand that embodiments may include any suitable number of pixels to form the display area according to the design of the display apparatus.

The substrate 100 may include glass, a metal, or a polymer resin. When the substrate 100 is flexible or bendable, the substrate 100 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. Various modifications may be made. For example, the substrate 100 may have a multi-layer structure including two layers each including a polymer resin and a barrier layer including an inorganic material (e.g., silicon oxide, silicon nitride, or silicon oxynitride) and located between the two layers.

Organic light-emitting devices are arranged over the substrate 100. In addition to the organic light-emitting devices, first through third thin-film transistors 211, 212, and 213 to which the organic light-emitting devices are electrically connected may be arranged over the substrate 100. When the organic light-emitting devices are electrically connected to the first through third thin-film transistors 211, 212, and 213, it may mean that first through third pixel electrodes 311, 312, and 313 of the organic light-emitting devices are electrically connected to the first through third thin-film transistors 211, 212, and 213.

For reference, in FIG. 1, the first thin-film transistor 211 is located in the first pixel PX1, the second thin-film transistor 212 is located in the second pixel PX2, and the third thin-film transistor 213 is located in the third pixel PX3. Accordingly, it is shown that the first pixel electrode 311 located in the first pixel PX1 is electrically connected to the first thin-film transistor 211, the second pixel electrode 312 located in the second pixel PX2 to be spaced apart from the first pixel electrode 311 is electrically connected to the second thin-film transistor 212, and the third pixel electrode 313 located in the third pixel PX3 to be spaced apart from the first pixel electrode 311 and the second pixel electrode 312 is electrically connected to the third thin-film transistor 213.

For convenience of description, the first thin-film transistor 211 will be described, and the description may also apply to the second thin-film transistor 212 and the third thin-film transistor 213. That is, some repetitive description of elements of the second thin-film transistor 212 and the third thin-film transistor 213 may be omitted.

The first thin-film transistor 211 may include a first semiconductor layer 211a including amorphous silicon, polycrystalline silicon, or an organic semiconductor material, a first gate electrode 211b, a first source electrode 211c, and a first drain electrode 211d. The first gate electrode 211b may include any of various conductive materials and may have any of various layer structures. For example, the first gate electrode 211b may include a molybdenum (Mo) layer and an aluminum (Al) layer. Each of the first source electrode 211c and the first drain electrode 211d may also have various conductive materials and various layer structures. For example, each of the first source electrode 211c and the first drain electrode 211d may include a titanium (Ti) layer and an Al layer.

In order to ensure insulation between the first semiconductor layer 211a and the first gate electrode 211b, a gate insulating film 121 including an inorganic material such as silicon oxide, silicon nitride, and/or silicon oxynitride may be located between the first semiconductor layer 211a and the first gate electrode 211b. An interlayer insulating film 131 including an inorganic material such as silicon nitride, silicon oxynitride, silicon oxide, titanium oxide, or aluminum oxide may be arranged on the first gate electrode 211b, and the first source electrode 211c and the first drain electrode 211d may be arranged on the interlayer insulating film 131. As such, an insulating film including an inorganic material may be formed by using chemical vapor deposition (CVD) or atomic layer deposition (ALD). This also applies to the following embodiments and modifications thereof.

A buffer layer 110 including at least one of a silicon nitride layer, a silicon oxynitride layer, a silicon oxide layer, a titanium oxide layer, or an aluminum oxide layer may be located between the substrate 100 and the first thin-film transistor 211 having the above structure. The buffer layer 110 may increase a flatness of (or planarize) a top surface of the substrate 100, or may prevent, reduce, or minimize impurities from the substrate 100 or the like from penetrating into the first semiconductor layer 211a of the first thin-film transistor 211.

A first planarization layer 141 may be arranged on the first thin-film transistor 211. For example, when an organic light-emitting device is located on the first thin-film transistor 211 as shown in FIG. 1, the first planarization layer 141 may substantially planarize a top surface of a protective film covering the first thin-film transistor 211. The first planarization layer 141 may be formed of an organic material such as acrylic resin, epoxy resin, phenolic resin, polyamide resin, polyimide resin, benzocyclobutene (BCB), or hexamethyldisiloxane (HMDSO). According to some embodiments, as shown in FIG. 1, a second planarization layer 142 may be located on the first planarization layer 141. In this case, a wiring or an element such as an electrode of a thin-film transistor may be located between the first planarization layer 141 and the second planarization layer 142. The second planarization layer 142 may be formed of an organic material such as acrylic resin, epoxy resin, phenolic resin, polyamide resin, polyimide resin, BCB, or HMDSO.

A description of the first semiconductor layer 211a, the first gate electrode 211b, the first source electrode 211c, and the first drain electrode 211d of the first thin-film transistor 211 applies to a second semiconductor layer 212a, the second gate electrode 212b, the second source electrode 212c, and the second drain electrode 212d of the second thin-film transistor 212 and a third semiconductor layer 213a, a third gate electrode 213b, a third source electrode 213c, and a third drain electrode 213d of the third thin-film transistor 213.

In the display area of the substrate 100, the first pixel electrode 311, the second pixel electrode 312, and the third pixel electrode 313 are located on the second planarization layer 142. The first pixel electrode 311 located on the second planarization layer 142 contacts any one of the first source electrode 211c and the first drain electrode 211d through an opening portion formed in the second planarization layer 142 to be electrically connected to the first thin-film transistor 211 as shown in FIG. 1. The second pixel electrode 312 located on the second planarization layer 142 may also contact any one of the second source electrode 212c and the second drain electrode 212d through an opening portion formed in the second planarization layer 142 to be electrically connected to the second thin-film transistor 212. The third pixel electrode 313 located on the second planarization layer 142 contacts any one of the third source electrode 213c and the third drain electrode 213d through an opening portion formed in the second planarization layer 142 to be electrically connected to the third thin-film transistor 213.

When the display apparatus is a top emission type display apparatus that emits light to the outside through a counter electrode 303, each of the first pixel electrode 311, the second pixel electrode 312, and the third pixel electrode 313 may be formed of a metal material having a high reflectance such as a stacked structure (Ti/Al/Ti) including aluminum and titanium, a stacked structure (ITO/Al/ITO) including aluminum and ITO, a stacked structure (ITO/Ag/ITO) including silver and ITO, an APC alloy, or a stacked structure (ITO/APC/ITO) including an APC alloy and ITO. The APC alloy is an alloy of silver (Ag), palladium (Pd), and/or copper (Cu).

When the display apparatus is a bottom emission type display apparatus that emits light to the outside through the first pixel electrode 311, the second pixel electrode 312, and the third pixel electrode 313, each of the first pixel electrode 311, the second pixel electrode 312, and the third pixel electrode 313 may include a transparent metal material (transparent conductive material (TCO)) capable of transmitting light therethrough such as ITO or IZO, or may include a semi-transmissive metal material (semi-transmissive conductive material) such as magnesium (Mg), silver (Ag), or an alloy of magnesium (Mg) and silver (Ag).

A pixel-defining film 150 may be arranged on the second planarization layer 142. The pixel-defining film 150 has an opening corresponding to each sub-pixel to define a pixel. That is, the pixel-defining film 150 may expose a central top surface of the first pixel electrode 311, a central top surface of the second pixel electrode 312, and a central top surface of the third pixel electrode 313 by covering an edge of the first pixel electrode 311, an edge of the second pixel electrode 312, and an edge of the third pixel electrode 313.

The pixel-defining film 150 may increase a distance between the edge of the first pixel electrode 311 and the counter electrode 303 over the first pixel electrode 311, to prevent an arc or the like from occurring at the edge of the first pixel electrode 311. The pixel-defining film 150 may be formed of an organic material such as acrylic resin, epoxy resin, phenolic resin, polyamide resin, polyimide resin, BCB, or HMDSO.

A first color emission layer 311a is arranged on the first pixel electrode 311, a second color emission layer 312a is arranged on the second pixel electrode 312, and a third color emission layer 313a is arranged on the third pixel electrode 313. The first color emission layer 311a may generate light having a wavelength belonging to a first wavelength band, the second color emission layer 312a may generate light having a wavelength belonging to a second wavelength band, and the third color emission layer 313a may generate light having a wavelength belonging to a third wavelength band.

The first wavelength band may range from about 450 nm to about 495 nm, the second wavelength band may range from about 495 nm to about 570 nm, and the third wavelength band may range from about 630 nm to about 750 nm. The first color emission layer 311a, the second color emission layer 312a, and the third color emission layer 313a may be formed by inkjet printing.

Not only the first color emission layer 311a, the second color emission layer 312a, and the third color emission layer 313a are arranged on the first pixel electrode 311, the second pixel electrode 312, and the third pixel electrode 313. For example, a hole injection layer (HIL) or a hole transport layer (HTL) may be located between the first pixel electrode 311, the second pixel electrode 312, and the third pixel electrode 313 and the first color emission layer 311a, the second color emission layer 312a, and the third color emission layer 313a, and an electron transport layer (ETL) or an electron injection layer (EIL) may be located between the first color emission layer 311a, the second color emission layer 312a, and the third color emission layer 313a and the counter electrode 303.

The hole injection layer, the hole transport layer, the electron transport layer, and/or the electron injection layer may be integrated layers on the first pixel electrode 311, the second pixel electrode 312, and the third pixel electrode 313, or when necessary, the hole injection layer, the hole transport layer, the electron transport layer, and/or the electron injection layer may be layers patterned to respectively correspond to the first pixel electrode 311, the second pixel electrode 312, and the third pixel electrode 313. The hole injection layer, the hole transport layer, the electron transport layer, and/or the electron injection layer may be formed by deposition, screen printing, laser-induced thermal imaging, or inkjet printing.

The counter electrode 303 is arranged on the first color emission layer 311a, the second color emission layer 312a, and the third color emission layer 313a. The counter electrode 303 may cover the display area. That is, the counter electrode 303 may be integrally formed with a plurality of organic light-emitting devices to correspond to the first pixel electrode 311, the second pixel electrode 312, and the third pixel electrode 313.

The counter electrode 303 covers the display area, and extends to the peripheral area outside the display area. Accordingly, the counter electrode 303 is electrically connected to an electrode power supply line located in the peripheral area. When the display apparatus is a top emission type display apparatus, the counter electrode 303 may include a transparent metal material (transparent conductive material (TCO)) capable of transmitting light therethrough such as ITO or IZO, or may include a semi-transmissive metal material (semi-transmissive conductive material) such as magnesium (Mg), silver (Ag), or an alloy of magnesium (Mg) and silver (Ag). When the display apparatus is a bottom emission type display apparatus, the counter electrode 303 may include a metal material having a high reflectance such as a stacked structure (Ti/Al/Ti) including aluminum and titanium, a stacked structure (ITO/Al/ITO) including aluminum and ITO, an APC alloy, or a stacked structure (ITO/APC/ITO) including an APC alloy and ITO. The APC alloy is an alloy of silver (Ag), palladium (Pd), and/or copper (Cu).

Because an organic light-emitting device may be relatively easily damaged by external moisture, oxygen, or the like, an encapsulation layer may cover and protect the organic light-emitting device. The encapsulation layer may cover the display area, and may extend to at least a part of the peripheral area. The encapsulation layer may include a first inorganic encapsulation layer, an organic encapsulation layer, and a second inorganic encapsulation layer.

Each of the first inorganic encapsulation layer and the second inorganic encapsulation layer may include silicon nitride, silicon oxynitride, silicon oxide, titanium oxide, or aluminum oxide. The organic encapsulation layer may include acrylic resin, epoxy resin, phenolic resin, polyamide resin, or polyimide resin.

As described above, the first color emission layer 311a and the second color emission layer 312a are formed by inkjet printing. That is, the first color emission layer 311a and the second color emission layer 312a are formed by locating a first color emission layer forming material by inkjet printing on a top surface of the first pixel electrode 311 exposed by the pixel-defining film 150 and locating a second color emission layer forming material by inkjet printing on a top surface of the second pixel electrode 312 exposed by the pixel-defining film 150.

Figure 2:
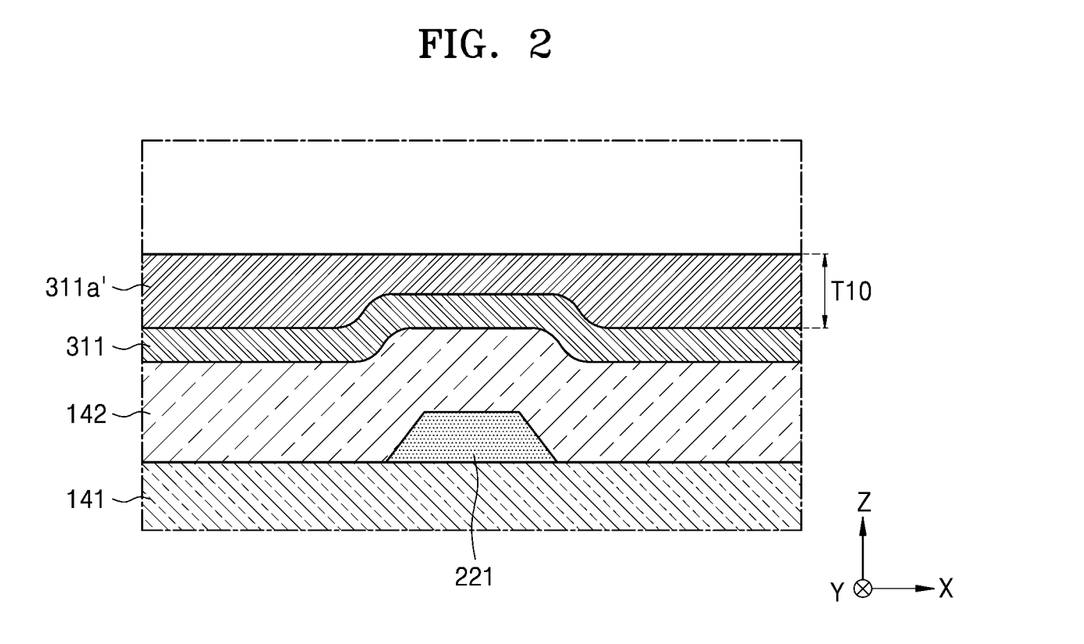
FIGS. 2 and 3 are cross-sectional views schematically illustrating further details of a process of manufacturing the display apparatus of FIG. 1 according to some embodiments.
Figure 3:
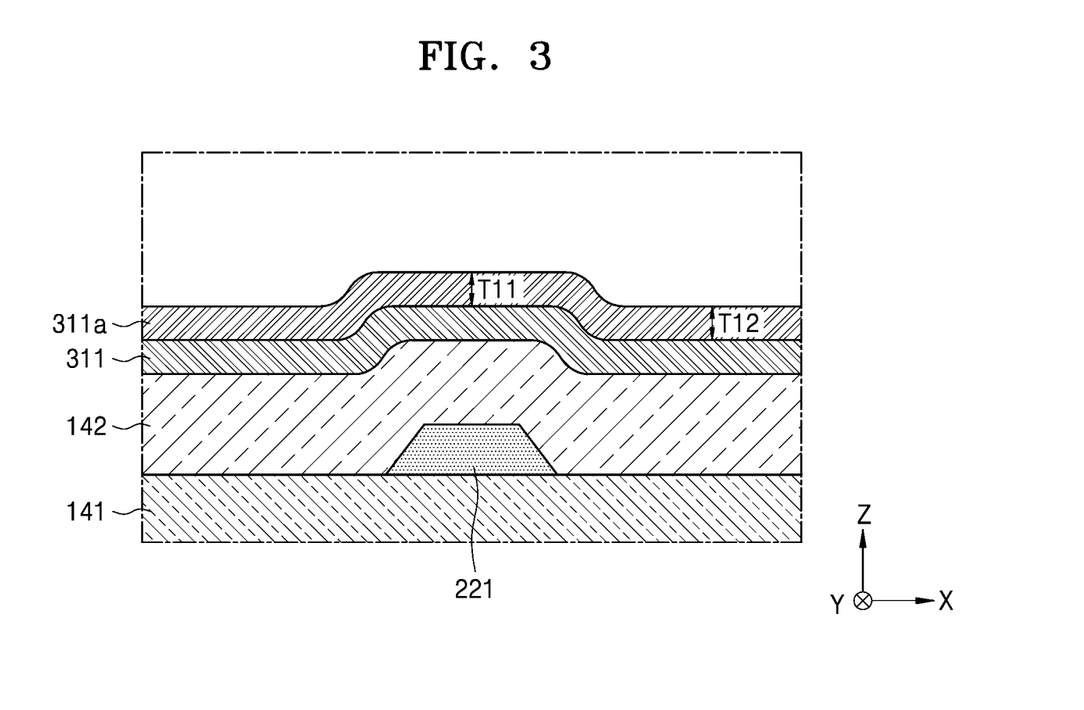

FIGS. 2 and 3 are cross-sectional views schematically illustrating a process of forming the first color emission layer 311a on the first pixel electrode 311. As shown in FIGS. 2 and 3, a first wiring 221 may be located below the first pixel electrode 311. In FIGS. 2 and 3, the first wiring 221 is located between the first planarization layer 141 and the second planarization layer 142. In this case, a top surface of the second planarization layer 142 may not be perfectly flat due to the first wiring 221. That is, the top surface of the second planarization layer 142 in a +z direction may have a stepped portion, or non-planar portion or area. According to some embodiments, the stepped or non-planar portion may have a thickness above the adjacent portion of the second planarization layer 142 that is less than a thickness of the first wiring 221 in a z-axis direction. Because the first pixel electrode 311 arranged on the second planarization layer 142 is formed according to a curvature (e.g., following a contour) of the top surface of the second planarization layer 142, the top surface of the first pixel electrode 311 in the +z direction may also have a stepped portion.

When a first color emission layer forming material 311a' is formed by using an inkjet printing method on the first pixel electrode 311 having the stepped portion of the top surface, the first color emission layer forming material 311a' has a shape as shown in FIG. 2 soon after dotting or deposition of the first color emission layer forming material 311a'. That is, the first color emission layer forming material 311a' on a portion of the first pixel electrode 311 closest to the substrate 100 has a thickness T10.

Next, because the first color emission layer forming material 311a' has fluidity, the first color emission layer forming material 311a' spreads along the top surface of the first pixel electrode 311, causing the top and bottom surfaces of the first color emission layer forming material 311a' to follow a contour of the first wiring 221 and/or the second planarization layer 142 and/or the first pixel electrode 311. Then, the first color emission layer forming material 311a' is cured to form the first color emission layer 311*a*. As a result, the first color emission layer 311*a* has a shape substantially conforming to (or following a contour of) the top surface of the first pixel electrode 311 as shown in FIG. 3. That is, a first thickness T11 of the first color emission layer 311*a* on a portion of the top surface of the first pixel electrode 311 farthest from the substrate 100 is the same as or similar to a second thickness T12 of the first color emission layer 311*a* on a portion of the top surface of the first pixel electrode 311 closest to the substrate 100. This is because a thickness of the first color emission layer 311*a* to be formed is small. The first thickness T11 of the first color emission layer 311*a* may not be the same as the second thickness T12 of the first color emission layer 311*a*, and actually, a thickness of the first color emission layer 311*a* may vary according to a position.

Figure 4:
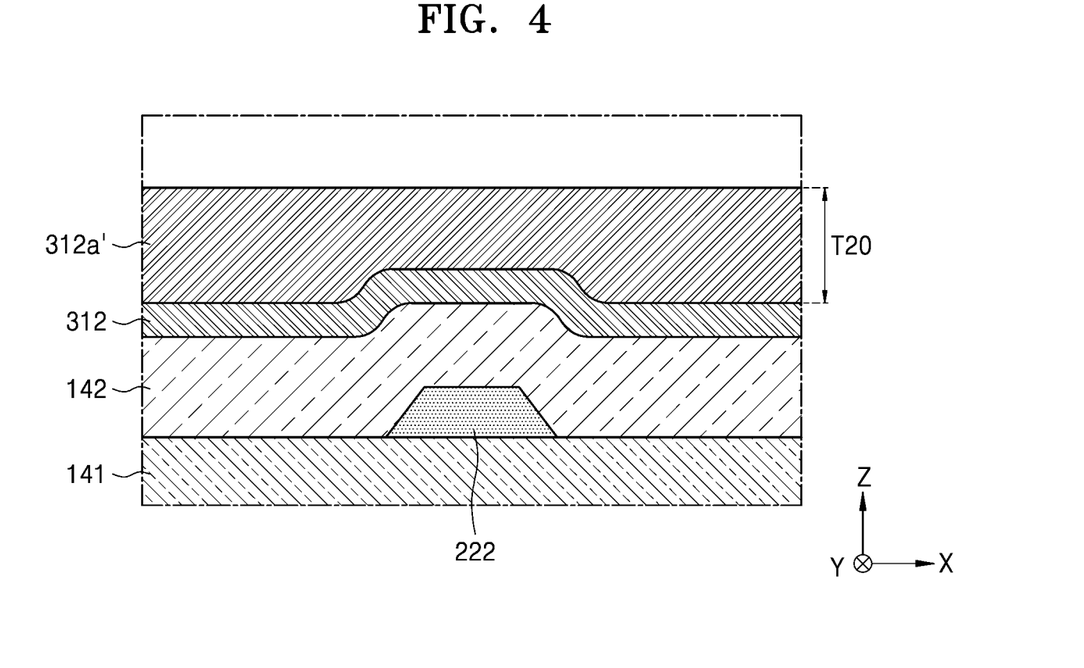
FIGS. 4 and 5 are cross-sectional views illustrating further details of a process of manufacturing the display apparatus of FIG. 1 according to some embodiments.
Figure 5:
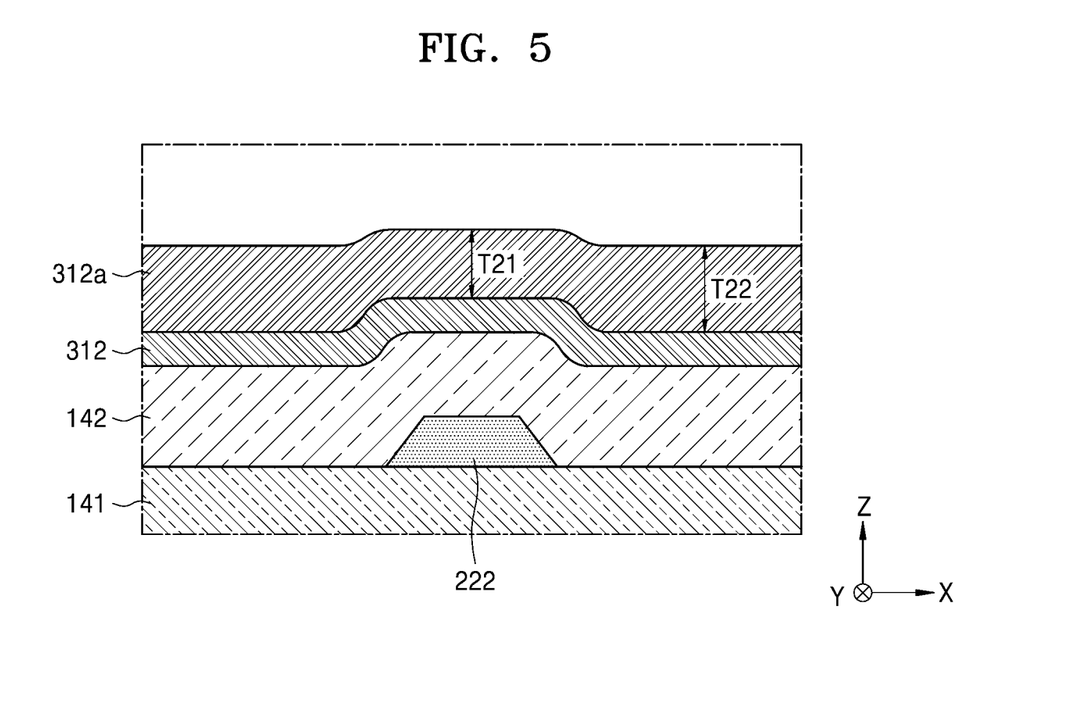

FIGS. 4 and 5 are cross-sectional views illustrating a process of forming the second color emission layer 312*a* on the second pixel electrode 312. As shown in FIGS. 4 and 5, a second wiring 222 may be located below the second pixel electrode 312. In FIGS. 4 and 5, the second wiring 222 is located between the first planarization layer 141 and the second planarization layer 142. In this case, the top surface of the second planarization layer 142 may not be perfectly flat due to the second wiring 222. That is, the top surface of the second planarization layer 142 in the +z direction may have a stepped portion whose thickness is less than a thickness of the second wiring 222 in the z-axis direction. Because the second pixel electrode 312 arranged on the second planarization layer 142 is formed according to a curvature (or generally following a contour) of the top surface of the second planarization layer 142, the top surface of the second pixel electrode 312 in the +z direction has a stepped or contoured portion at or above (e.g., overlapping) the second wiring 222.

When a second color emission layer forming material 312*a*' is formed by using an inkjet printing method on the second pixel electrode 312 having the stepped portion of the top surface, the second color emission layer forming material 312*a*' has a shape as shown in FIG. 4 immediately after dotting or deposition. That is, the second color emission layer forming material 312*a*' on a portion of the top surface of the second pixel electrode 312 closest to the substrate 100 has a thickness T20. The thickness T20 may be greater than the thickness T10 of the first color emission layer forming material 311*a*' of FIG. 2.

Next, because the second color emission layer forming material 312*a*' has fluidity, the second color emission layer forming material 312*a*' spreads along the top surface of the second pixel electrode 312. Then, the second color emission layer forming material 312*a*' is cured. As a result, the second color emission layer forming material 312*a* has a shape substantially conforming to the top surface of the second pixel electrode 312 as shown in FIG. 5. However, because the thickness T20 of the second color emission layer forming material 312*a*' of FIG. 4 is greater than the thickness T10 of the first color emission layer forming material 311*a*' of FIG. 2, the second color emission layer 312*a* slightly planarizes the top surface of the second pixel electrode 312. As a result, a first thickness T21 of the second color emission layer 312*a* on a portion of the top surface of the second pixel electrode 312 farthest from the substrate 100 is less than a second thickness T22 of the second color emission layer 312*a* on a portion of the top surface of the second pixel electrode 312 closest to the substrate 100. That is, a thickness uniformity of the second color emission layer 312*a* is less than a thickness uniformity of the first color emission layer 311*a*.

Figure 6:
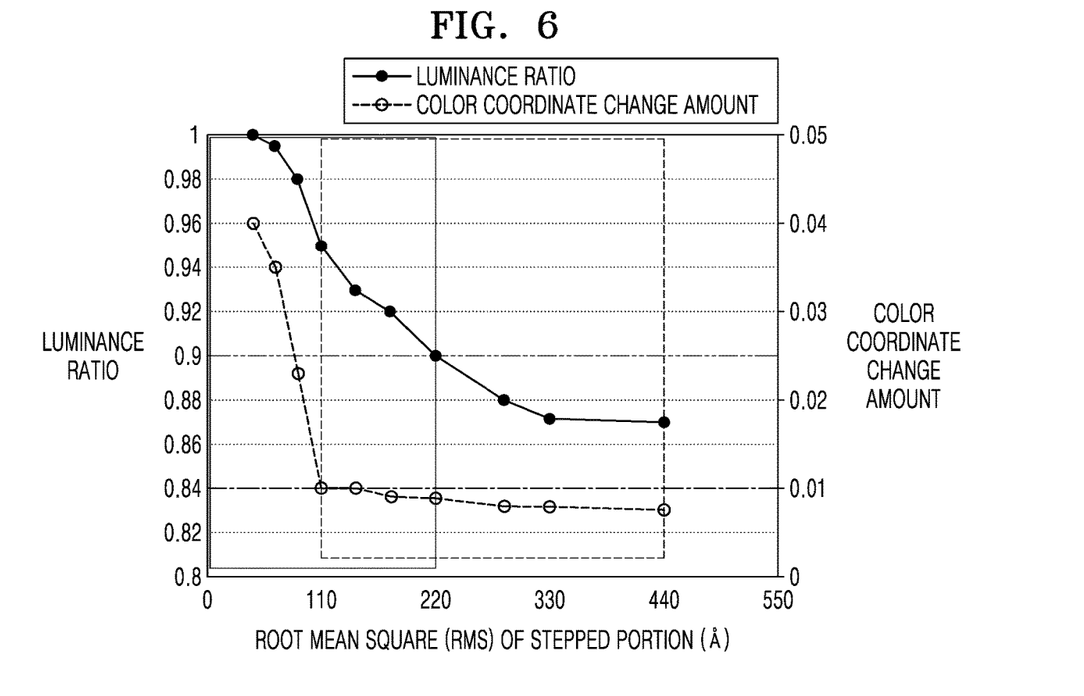
FIGS. 6 through 8 are graphs for describing thicknesses of elements in a display apparatus, according to some embodiments.

As a thickness uniformity of an emission layer decreases, a luminance of light emitted by a corresponding pixel may decrease. FIG. 6 is a graph illustrating a relationship between a luminance ratio and a color coordinate change amount (Δu'v') of light emitted by the second pixel PX2. A horizontal axis of FIG. 6 represents a root mean square (RMS) of the stepped portion formed on the top surface of the second pixel electrode 312, a left vertical axis represents a luminance ratio of light emitted by the second pixel PX2, and a right vertical axis represents a color coordinate change amount (Δu'v') of light emitted by the second pixel PX2.

For example, a solid line of the graph of FIG. 6 represents a ratio of a luminance of light emitted by the second pixel PX2 when the stepped portion exists on the top surface of the second pixel electrode 312, based on a luminance of light emitted by the second pixel PX2 when the stepped portion does not exist on the top surface of the second pixel electrode 312. As a luminance ratio increases, it means that a luminance does not decrease. A dashed line of the graph of FIG. 6 represents a change amount of color coordinates of light emitted by the second pixel PX2 when the stepped portion exists on the top surface of the second pixel electrode 312, based on color coordinates of ideal light (green light) emitted by the second pixel PX2. As the color coordinate change amount (Δu'v') decreases, it means that light of a color closer to preset color coordinates is emitted.

As described above, the second color emission layer 312*a* of the second pixel PX2 may emit light having the wavelength belonging to the wavelength band ranging from about 495 nm to about 570 nm.

As seen from the graph of FIG. 6, as the stepped portion formed on the top surface of the second pixel electrode 312 increases, a luminance of light emitted by the second pixel PX2 decreases. Accordingly, in order to emit light with a luminance equal to or greater than 90% based on a luminance of light emitted by the second pixel PX2 when the stepped or contoured portion does not exist on the top surface of the second pixel electrode 312, the stepped portion of the top surface of the second pixel electrode 312 may be within a rectangular range marked by a solid line in FIG. 6. That is, a root mean square of the stepped portion formed on the top surface of the second pixel electrode 312 may be equal to or less than 22 nm.

Also, as seen from the graph of FIG. 6, as the stepped portion formed on the top surface of the second pixel electrode 312 decreases, a difference between color coordinates of light emitted by the second color emission layer 312*a* and color coordinates of ideal second color light increases. Accordingly, in order for the color coordinate change amount (Δu'v') to be less than 0.01, the stepped portion of the top surface of the second pixel electrode 312 may be within a rectangular range marked by a dashed line in FIG. 6. That is, a root mean square of the stepped portion formed on the top surface of the second pixel electrode 312 may be equal to or greater than 11 nm.

Accordingly, as a result, a root mean square of the stepped portion formed on the top surface of the second pixel electrode 312 may be equal to or greater than 11 nm and equal to or less than 22 nm.

Figure 7:
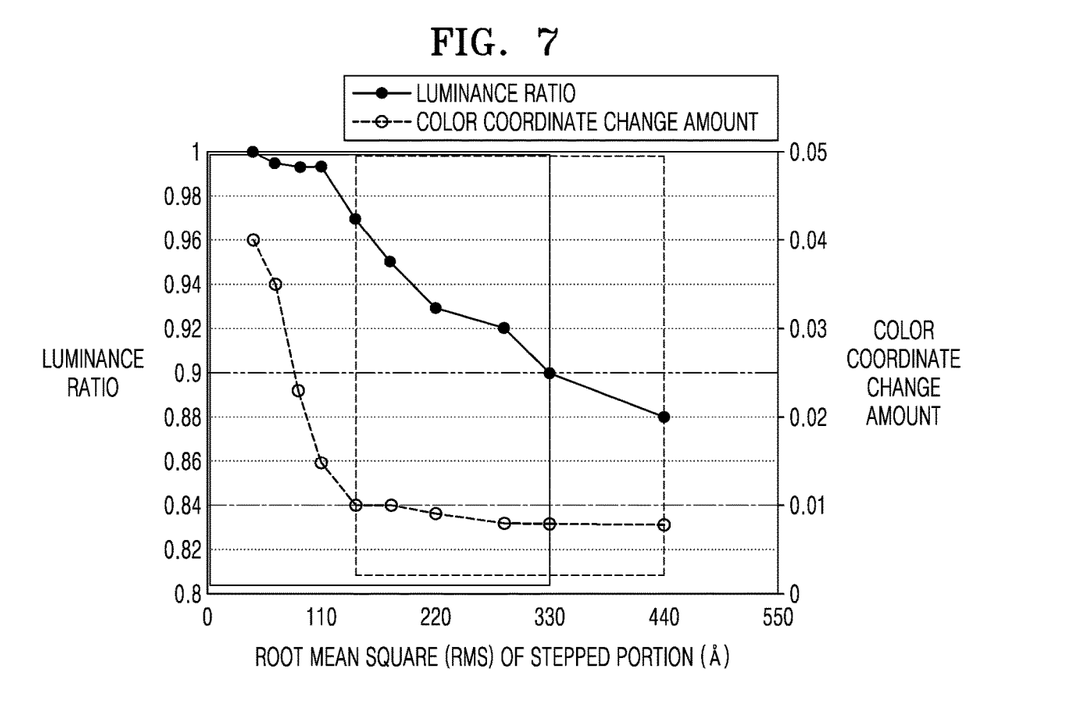

FIG. 7 is a graph illustrating a relationship between a luminance ratio and a color coordinate change amount (Δu'v') of light emitted by the first pixel PX1. A horizontal axis of FIG. 7 represents a root mean square (RMS) of the stepped portion formed on the top surface of the first pixel electrode 311, a left vertical axis represents a luminance ratio of light emitted by the first pixel PX1, and a right vertical axis represents a color coordinate change amount (Δu'v') of light emitted by the first pixel PX1.

For example, a solid line of the graph of FIG. 7 represents a ratio of a luminance of light emitted by the first pixel PX1 when the stepped portion exists on the top surface of the first pixel electrode 311, based on a luminance of light emitted by the first pixel PX1 when the stepped portion does not exist on the top surface of the first pixel electrode 311. As a luminance ratio increases, it means that a luminance does not decrease. A dashed line of the graph of FIG. 7 represents a change amount of color coordinates of light emitted by the first pixel PX1 when the stepped portion exists on the top surface of the first pixel electrode 311, based on color coordinates of ideal light (blue light) emitted by the first pixel PX1. As the color coordinate change amount (Δu'v') decreases, it means that light of a color closer to preset color coordinates is emitted.

As described above, the first color emission layer 311a of the first pixel PX1 may emit light having the wavelength belonging to the wavelength band ranging from about 450 nm to about 495 nm.

As seen from the graph of FIG. 7, as the stepped portion formed on the top surface of the first pixel electrode 311 increases, a luminance of light emitted by the first pixel PX1 decreases. Accordingly, in order to emit light having a luminance equal to or greater than 90% based on a luminance of light emitted by the first pixel PX1 when the stepped portion does not exist on the top surface of the first pixel electrode 311, the stepped portion of the top surface of the first pixel electrode 311 may be within a rectangular range marked by a solid line in FIG. 7. That is, a root mean square of the stepped portion formed on the top surface of the first pixel electrode 311 may be equal to or less than 33 nm.

Also, as seen from the graph of FIG. 7, as the stepped portion formed on the top surface of the first pixel electrode 311 decreases, a difference between color coordinates of light emitted by the first color emission layer 311a and color coordinates of ideal first color light increases. Accordingly, in order for the color coordinate change amount (Δu'v') to be less than 0.01, the stepped portion of the top surface of the first pixel electrode 311 may be within a rectangular range marked by a dashed line in FIG. 7. That is, a root mean square of the stepped portion formed on the top surface of the first pixel electrode 311 may be equal to or greater than 14 nm.

Accordingly, as a result, a root mean square of the stepped portion formed on the top surface of the first pixel electrode 311 may be equal to or greater than 14 nm and equal to or less than 33 nm.

For reference, as described above, because a thickness of the second color emission layer 312a is greater than a thickness of the first color emission layer 311a, an effect of the stepped portion of the top surface of the second pixel electrode 312 on the second color emission layer 312 is greater than an effect of the stepped portion of the top surface of the first pixel electrode 311 on the first color emission layer 311a. Accordingly, a root mean square of the stepped portion formed on the top surface of the second pixel electrode 312, which is equal to or greater than 11 nm and equal to or less than 22 nm, may be less than a root mean square of the stepped portion formed on the top surface of the first pixel electrode 311, which is equal to or greater than 14 nm and equal to or less than 33 nm. That is, a flatness of the top surface of the second pixel electrode 312 may be higher than a flatness of the top surface of the first pixel electrode 311.

For reference, the reason why a thickness of the second color emission layer 312a is greater than a thickness of the first color emission layer 311a is that the wavelength of light emitted by the second color emission layer 312a is longer than the wavelength of light emitted by the first color emission layer 311a. In an organic light-emitting display device, an emission layer that emits light having a shorter wavelength may have a smaller thickness.

Figure 8:
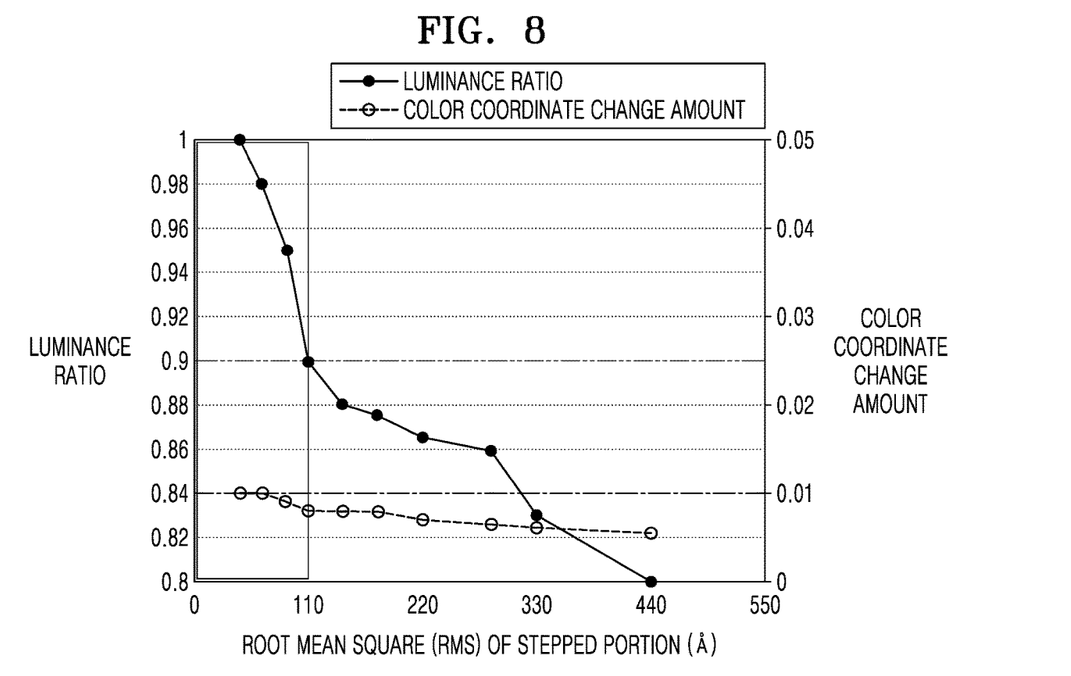

FIG. 8 is a graph illustrating a relationship between a luminance ratio of light and a color coordinate change amount (Δu'v') emitted by the third pixel PX3. A horizontal axis of FIG. 8 represents a root mean square (RMS) of a stepped portion formed on a top surface of the third pixel electrode 313, a left vertical axis represents a luminance ratio of light emitted by the third pixel PX3, and a right vertical axis represents a color coordinate change amount (Δu'v') of light emitted by the third pixel PX3.

For example, a solid line of the graph of FIG. 8 represents a ratio of a luminance of light emitted by the third pixel PX3 when the stepped portion exists on the top surface of the third pixel electrode 313, based on a luminance of light emitted by the third pixel PX3 when the stepped portion does not exist on the top surface of the third pixel electrode 313. As a luminance ratio increases, it means that a luminance does not decrease. A dashed line of the graph of FIG. 8 represents a change amount of color coordinates of light emitted by the third pixel PX3 when the stepped portion exists on the top surface of the third pixel electrode 313, based on color coordinates of ideal light (red light) emitted by the third pixel PX3. As the color coordinate change amount (Δu'v') decreases, it means that light of a color closer to preset color coordinates is emitted.

As described above, the third color emission layer 313a of the third pixel PX3 may emit light having the wavelength belonging to the wavelength band ranging from about 630 nm to about 750 nm.

As seen from the graph of FIG. 8, as the stepped portion formed on the top surface of the third pixel electrode 313 increases, a luminance of light emitted by the third pixel PX3 decreases. Accordingly, in order to emit light having a luminance equal to or greater than 90% based on a luminance of light emitted by the third pixel PX3 when the stepped portion does not exist on the top surface of the third pixel electrode 313, the stepped portion of the top surface of the third pixel electrode 313 may be within a rectangular range marked by a solid line in FIG. 8. That is, a root mean square of the stepped portion formed on the top surface of the third pixel electrode 313 may be equal to or less than 500 nm.

As seen from the graph of FIG. 8, as the stepped portion formed on the top surface of the third pixel electrode 313 decreases, a difference between color coordinates of light emitted by the third color emission layer 313a and color coordinates of ideal third color light increases. However, as seen from the graph of FIG. 8, the color coordinate change amount (Δu'v') is maintained to be less than 0.01, regardless of the stepped portion formed on the top surface of the third pixel electrode 313.

Accordingly, a root mean square of the stepped portion formed on the top surface of the third pixel electrode 313 may be equal to or less than 11 nm. It may be impossible to cause a root mean square of the stepped portion formed on the top surface of the third pixel electrode 313 to be equal to or less than 2 nm, when considering a wiring or the like located under the third pixel electrode 313 in an actual organic light-emitting display apparatus. Hence, a root mean square of the stepped portion formed on the top surface of the third pixel electrode 313 may be equal to or greater than 2 nm and equal to or less than 11 nm.

For reference, because a thickness of the third color emission layer 313a is greater than a thickness of the second color emission layer 312a, an effect of the stepped portion of the top surface of the third pixel electrode 313 on the third color emission layer 313a is greater than an effect of the stepped portion of the top surface of the second pixel electrode 312 on the second color emission layer 312a. Accordingly, a root mean square of the stepped portion formed on the top surface of the third pixel electrode 313, which is equal to or greater than 2 nm and equal to or less than 11 nm, is less than a root mean square of the stepped portion formed on the top surface of the second pixel electrode 312, which is equal to or greater than 11 nm and equal to or less than 22 nm. That is, a flatness of the top surface of the third pixel electrode 313 may be higher than a flatness of the top surface of the second pixel electrode 312.

For reference, the reason why a thickness of the third color emission layer 313a is greater than a thickness of the second color emission layer 312a is that the wavelength of light emitted by the third color emission layer 313a is longer than the wavelength of light emitted by the second color emission layer 312a. In an organic light-emitting display apparatus, an emission layer that emits light having a shorter wavelength may have a smaller thickness.

For reference, in preparing the graphs of FIGS. 6 through 8, a luminance in an ideal case where a stepped portion of a top surface of a pixel electrode is 0 was measured in test pixels manufactured for testing so that no wiring is located under the pixel electrode. Except that no wiring is located under the pixel electrode, conditions of the test pixels, for example, a thickness or a width of each layer, were the same as conditions of pixels in an actual organic light-emitting display apparatus.

Figure 9:
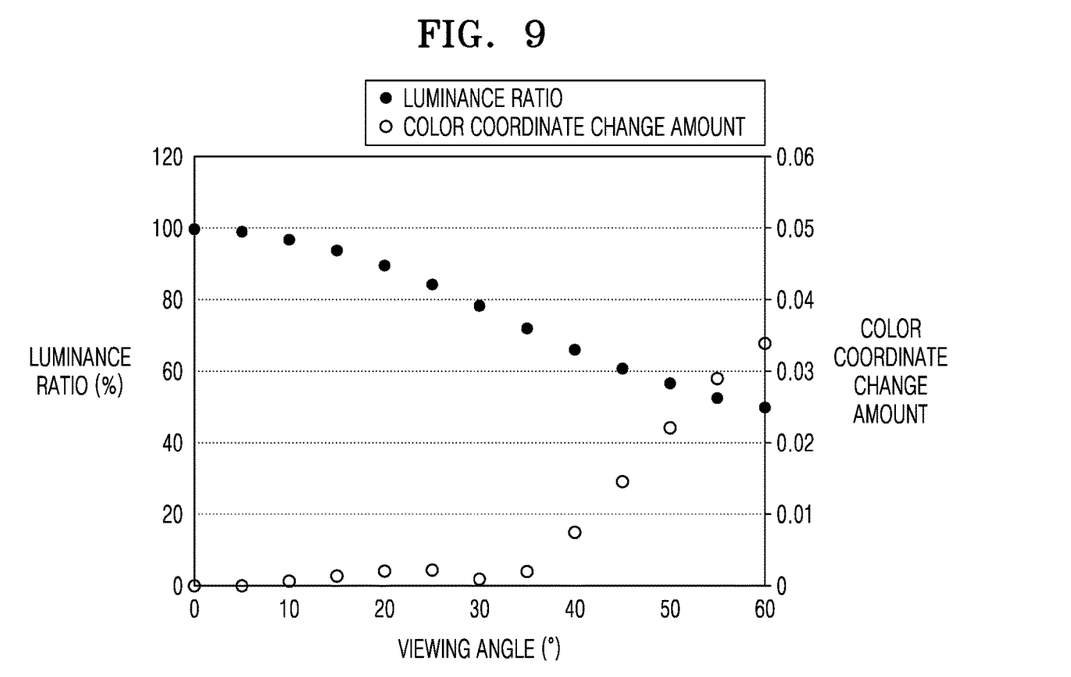
FIG. 9 is a graph illustrating a relationship among a viewing angle, a luminance ratio, and a color coordinate change amount in a specific pixel of a display apparatus according to a comparative example.

FIG. 9 is a graph illustrating a relationship among a viewing angle, a luminance ratio, and a color coordinate change amount in a sub-pixel that emits green light of a display apparatus according to a comparative example. A horizontal axis of FIG. 9 represents a viewing angle, a left vertical axis represents a luminance ratio of emitted green light, and a right vertical axis represents a color coordinate change amount (Δu'v') of the emitted green light. In a sub-pixel that emits green light of the display apparatus according to the comparative example, a root mean square of a stepped portion of a top surface of a pixel electrode is less than 11 nm.

As shown in FIG. 9, in the display apparatus according to the comparative example, it is found that a color coordinate change amount greatly varies according to a viewing angle. That is, it is found that when a viewing angle is greater than 40°, a color coordinate change amount greatly increases.

Figure 10:
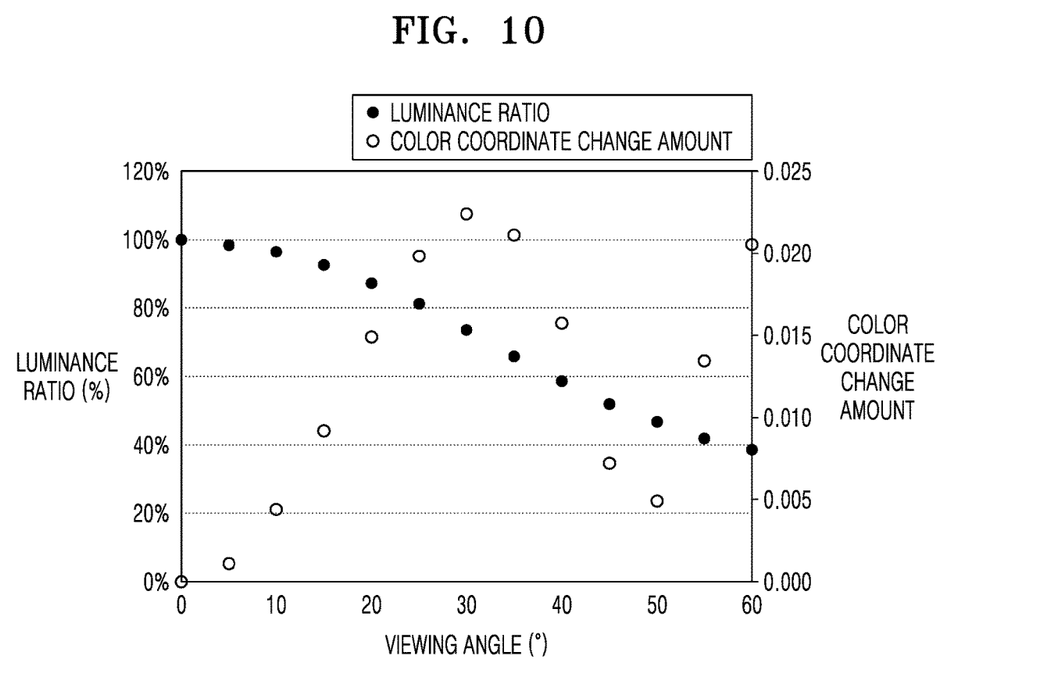
FIG. 10 is a graph illustrating a relationship among a viewing angle, a luminance ratio, and a color coordinate change amount of the display apparatus according to the comparative example of FIG. 9.

FIG. 10 is a graph illustrating a relationship among a viewing angle, a luminance ratio, and a color coordinate change amount, in the display apparatus according to the comparative example including a green sub-pixel showing a result as shown in FIG. 9, a red sub-pixel in which a root mean square of a stepped portion of a top surface of a pixel electrode ranges from about 2 nm to about 11 nm, and a blue sub-pixel in which a root mean square of a stepped portion of a top surface of a pixel electrode ranges from about 14 nm to about 33 nm. The graph of FIG. 10 is a graph using data obtained in a state where the display apparatus according to the comparative example is configured to emit white light. A horizontal axis of FIG. 10 represents a viewing angle, a left vertical axis represents a luminance ratio of emitted white light, and a right vertical axis represents a color coordinate change amount (Δu'v') of the emitted white light. As shown in FIG. 10, it is found that a color coordinate change amount greatly varies according to a viewing angle. In particular, it is found that, when a viewing angle is about 30° and when a viewing angle is greater than 50°, a color coordinate change amount rapidly increases.

Figure 11:
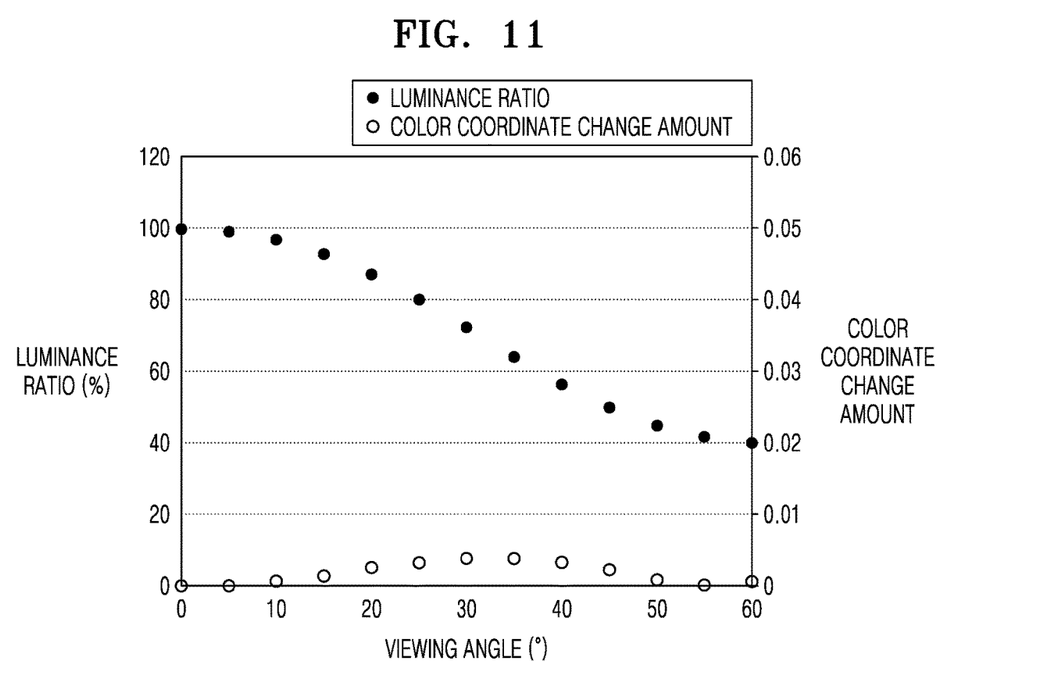
FIG. 11 is a graph illustrating a relationship among a viewing angle, a luminance ratio, and a color coordinate change amount in a specific pixel of a display apparatus according to some embodiments.

FIG. 11 is a graph illustrating a relationship among a viewing angle, a luminance ratio, and a color coordinate change amount in a green pixel of a display apparatus according to some embodiments. That is, FIG. 11 is a graph illustrating a relationship among a viewing angle, a luminance ratio, and a color coordinate change amount in a green pixel in which a root mean square of a stepped portion of a top surface of a pixel electrode ranges from about 11 nm to about 20 nm. As shown in FIG. 11, it is found that a color coordinate change amount according to a viewing angle is very small.

Figure 12:
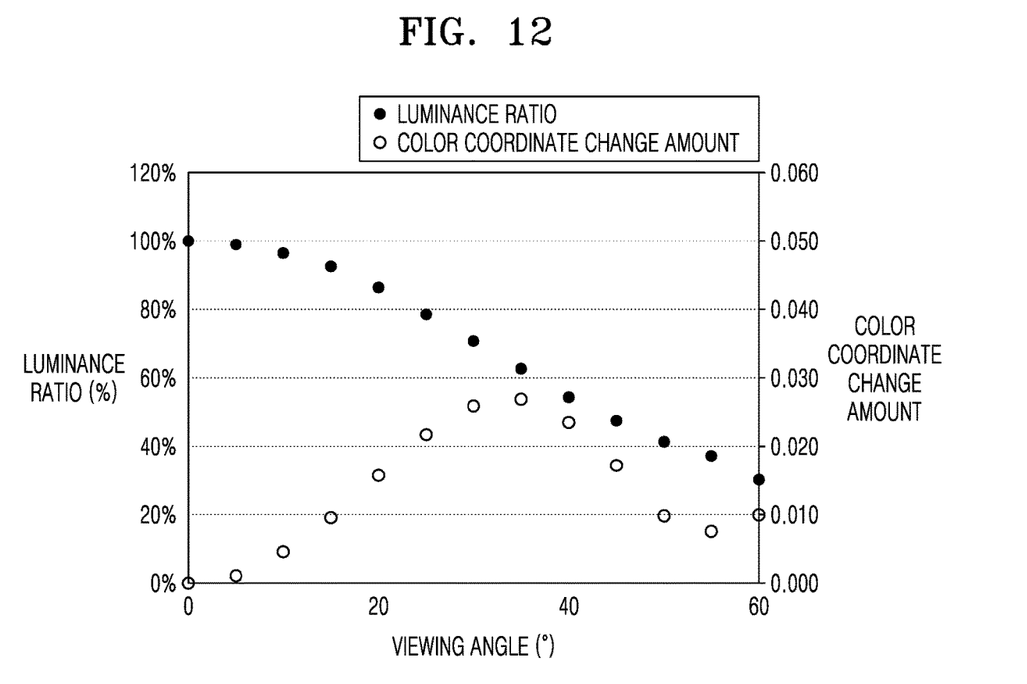
FIG. 12 is a graph illustrating a relationship among a viewing angle, a luminance ratio, and a color coordinate change amount of the display apparatus of FIG. 11 according to some embodiments.

FIG. 12 is a graph illustrating a relationship among a viewing angle, a luminance ratio, and a color coordinate change amount, in the display apparatus including a green sub-pixel showing a result as shown in FIG. 11, a red sub-pixel in which a root mean square of a stepped portion of a top surface of a pixel electrode ranges from about 2 nm to about 11 nm, and a blue sub-pixel in which a root mean square of a stepped portion of a top surface of a pixel electrode ranges from about 14 nm to about 33 nm. The graph of FIG. 12 is a graph using data obtained in a state where the display apparatus according to some embodiments is configured to emit white light. A horizontal axis of FIG. 12 represents a viewing angle, a left vertical axis represents a luminance ratio of emitted white light, and a right vertical axis represents a color coordinate change amount (Δu'v') of the emitted white light. As shown in FIG. 12, it is found that a color coordinate change amount when a viewing angle is about 30° is much smaller than a color coordinate change amount when a viewing angle is about 30 in the display apparatus according to the comparative example of FIG. 10. For example, it is found that even when a viewing angle is greater than 50°, a color coordinate change amount is kept relatively small.

According to the one or more embodiments, an organic light-emitting display apparatus capable of displaying a high-quality image may be provided. However, the disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims, and their equivalents.

What is claimed is:

1. An organic light-emitting display apparatus comprising:
   a first pixel electrode;
   a second pixel electrode over a wiring and spaced apart from the first pixel electrode and comprising a top surface that is flatter than a top surface of the first pixel electrode;
   a first color emission layer on the first pixel electrode; and
   a second color emission layer, having a thickness greater than a thickness of the first color emission layer, on the second pixel electrode and configured to emit light having a wavelength longer than a wavelength of light emitted by the first color emission layer, and the thickness of the second color emission layer over the wiring is less than the thickness of the second color emission layer away from the wiring.

2. The organic light-emitting display apparatus of claim 1, wherein the wavelength of light emitted by the first color emission layer belongs to a wavelength band ranging from 450 nanometers (nm) to 495 nm.

3. The organic light-emitting display apparatus of claim 2, wherein the wavelength of light emitted by the second color emission layer belongs to a wavelength band ranging from 495 nm to 570 nm.

4. The organic light-emitting display apparatus of claim 1, wherein a root mean square (RMS) of a stepped portion of the top surface of the first pixel electrode ranges from 14 nanometers (nm) to 33 nm.

5. The organic light-emitting display apparatus of claim 4, wherein the wavelength of light emitted by the first color emission layer belongs to a wavelength band ranging from 450 nm to 495 nm.

6. The organic light-emitting display apparatus of claim 5, wherein the wavelength of light emitted by the second color emission layer belongs to a wavelength band ranging from 495 nm to 570 nm.

7. The organic light-emitting display apparatus of claim 4, wherein an RMS of a stepped portion of the top surface of the second pixel electrode ranges from 11 nm to 22 nm.

8. The organic light-emitting display apparatus of claim 1, further comprising:

a third pixel electrode spaced apart from the first pixel electrode and the second pixel electrode and comprising a top surface that is flatter than a top surface of the second pixel electrode; and a third color emission layer on the third pixel electrode and configured to emit light having a wavelength longer than the wavelength of light emitted by the second color emission layer.

9. The organic light-emitting display apparatus of claim 8, wherein the wavelength of light emitted by the first color emission layer belongs to a wavelength band ranging from 450 nm to 495 nm.

10. The organic light-emitting display apparatus of claim 9, wherein the wavelength of the light emitted by the second color emission layer belongs to a wavelength band ranging from 495 nm to 570 nm.

11. The organic light-emitting display apparatus of claim 10, wherein the wavelength of light emitted by the third color emission layer belongs to a wavelength band ranging from 630 nm to 750 nm.

12. The organic light-emitting display apparatus of claim 8, wherein a root mean squared (RMS) of a stepped portion of the top surface of the first pixel electrode ranges from 14 nm to 33 nm.

13. The organic light-emitting display apparatus of claim 12, wherein an RMS of a stepped portion of the top surface of the second pixel electrode ranges from 11 nm to 22 nm.

14. The organic light-emitting display apparatus of claim 13, wherein an RMS of a stepped portion of the top surface of the third pixel electrode ranges from 2 nm to 11 nm.

* * * * *